United States Patent

Herzog et al.

[15] 3,636,618

[45] Jan. 25, 1972

[54] OHMIC CONTACT FOR SEMICONDUCTOR DEVICES

[72] Inventors: Arno Henry Herzog, St. Louis; James F. Caldwell, Hazelwood; John George Schmidt, St. Louis, all of Mo.; Enghua Lim, Los Gatos, Calif.

[73] Assignee: Monsanto Company, St. Louis, Mo.

[22] Filed: Mar. 23, 1970

[21] Appl. No.: 21,637

[52] U.S. Cl. ....................29/589, 148/185, 317/234

[51] Int. Cl. ....................B01j 17/00, H01l 7/02

[58] Field of Search ....................29/569 L, 589, 590; 148/185; 317/234 L, 234 M

[56] References Cited

UNITED STATES PATENTS

| | | | |
|---|---|---|---|
| 3,368,274 | 2/1968 | Brunet | 29/589 |
| 3,396,454 | 8/1968 | Murdock et al. | 29/589 UX |
| 3,480,412 | 11/1969 | Duffek et al. | 317/234 M |
| 3,514,675 | 5/1970 | Purdom | 148/185 X |

*Primary Examiner*—John F. Campbell
*Assistant Examiner*—W. Tupman
*Attorney*—William I. Andress, John D. Upham and Neal E. Willis

[57] ABSTRACT

The disclosure herein relates to a method for forming ohmic contacts to the backside of solid-state semiconductor devices comprising a sequential deposition and alloying of a multilayered structure comprising, respectively, tin, gold, nickel and gold alloyed to the semiconductor body, which is then mounted on a gold-plated metal base with a gold epoxy preform. Other suitable base and preform materials are also disclosed.

10 Claims, 7 Drawing Figures

INVENTORS
ARNO H. HERZOG
JAMES F. CALDWELL
JOHN G. SCHMIDT
ENGHUA LIM
BY William J. Andress
ATTORNEY

OHMIC CONTACT FOR SEMICONDUCTOR DEVICES

BACKGROUND OF THE INVENTION

This invention relates to the field of ohmic contact systems for the backside of solid-state light-emitting diodes (LED's).

Current and prior art methods disclose the use of various metals or alloys to form ohmic contact to either N- or P-regions of a semiconductor device. In some cases ohmic contact materials require soldering to the semiconductor device. Other ohmic contacts have been formed during growth of the semiconductor crystal. Still another system relies upon the application of high pressures to attach the contact material to the semiconductor.

Certain disadvantages in some prior art ohmic contact systems reside in the application of high temperatures or pressures or the use of contact materials which adversely affect the electrical properties of the crystal. Other problems in some prior art ohmic contacts relate to poor adhesion or contact to the semiconductor crystal giving rise to erratic performance and/or failure of the device.

Accordingly, it is an object of this invention to provide a backside ohmic contact system for solid-state semiconductor devices which does not require high-temperature soldering or pressure contacting and which provides a coherent bond with the semiconductor crystal.

A further object of this invention is the provision of an excellent backside ohmic contact to planar, monolithic solid-state light-emitting diodes and arrays thereof.

SUMMARY OF THE INVENTION

In accordance with this invention ohmic contact is provided to semiconductor materials of N-type conductivity by means of applying a plurality of layers of components of the contact system to the semiconductor, commonly the backside, whether as discrete diodes or as arrays thereof, in a sequence which, in one embodiment, comprises first evaporating a layer of tin onto the semiconductor, followed by an evaporated film of gold; the structure is then heated to alloy the tin and gold with the semiconductor thus forming an $N^+$ region therein. Thereafter, the alloyed structure is plated with a layer of nickel, followed by a layer of gold evaporated onto the nickel layer. The entire structure is then heated to alloy the nickel and gold with the components of the $N^+$ region of the semiconductor crystal. In another preferred embodiment, the several respective layers of tin, gold, nickel and gold are all applied before the structure is alloyed to form the $N^+$ region of the semiconductor and a nickel-rich layer in contact therewith. The alloyed structure for use with either a discrete diode or an array thereof, is then placed atop a preform of a gold/epoxy mixture which, in turn, is placed upon a gold-plated base material or header, or alternatively, a gold/palladium screen printed base such as alumina. The entire assembly is then heated to bond the semiconductor crystal to the base. Electrical leads are attached to the P-surface directly or to the metal contact on the P-surface of the device and to the gold-plated base. After the leads are attached, a lens is applied to the device which is now ready for operation.

DESCRIPTION OF THE PREFERRED EMBODIMENTS

EXAMPLE 1

Figures 1, 1A, 1B, 1C, 1D, 2, 3, 4:
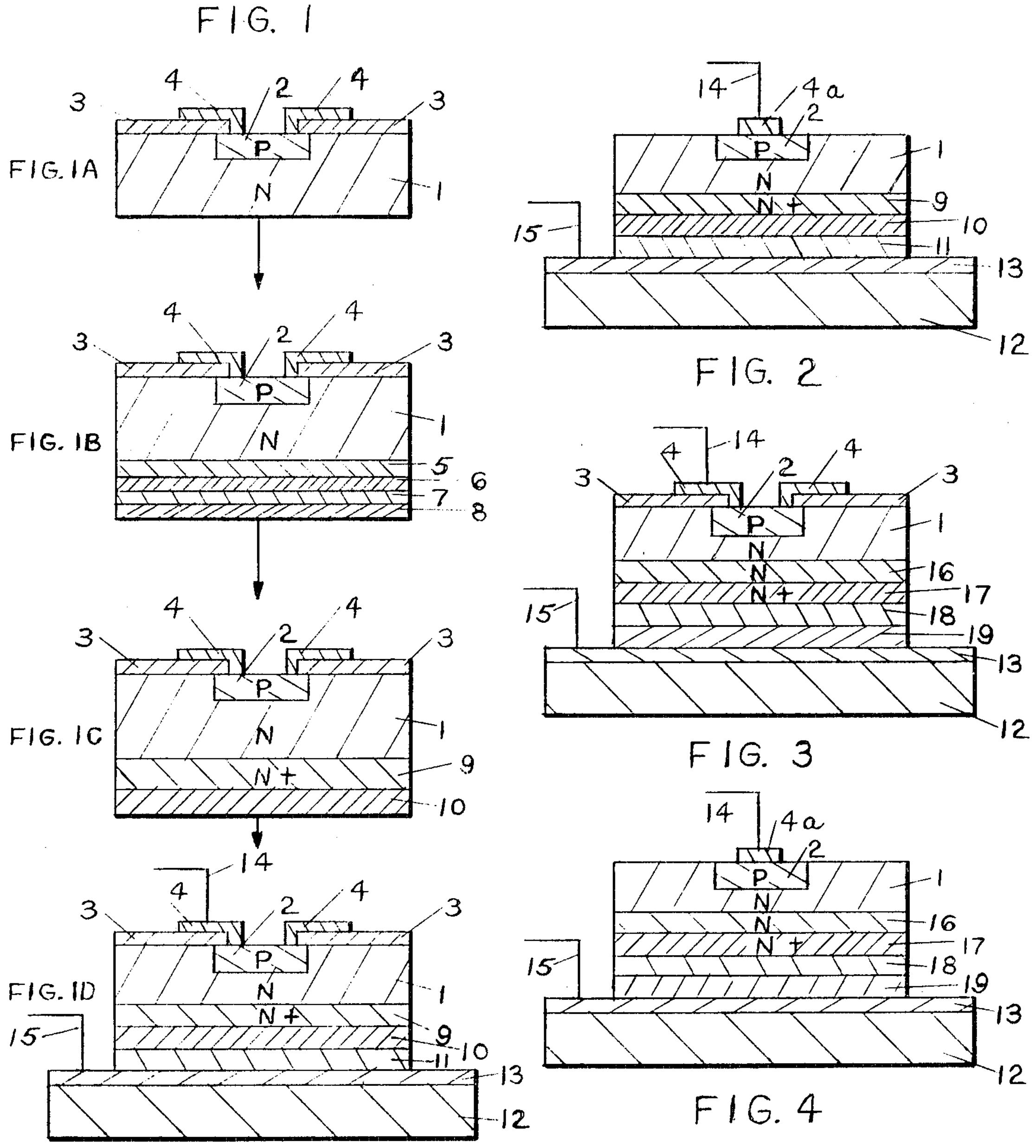
FIG. 1 is schematic flow diagram showing in cross section the successive steps in fabricating a solid-state semiconductor LED device according to one embodiment of the invention having the ohmic contact structure according to this invention.
FIG. 2 shows a cross-sectional schematic view of a modification of the LED device shown in FIG. 1D, wherein the metallized ohmic contact is made directly to the P-surface of the semiconductor crystal without an intervening layer of silica therebetween and the ohmic contact of this invention is attached to the backside of the crystal.
FIG. 3 is a schematic view in cross section of another semiconductor LED device embodiment wherein the original substrate with an epitaxial film deposited thereon is retained in a device fabricated with the backside ohmic contact of this invention.
FIG. 4 is a schematic cross section view of a modification of the LED device shown in FIG. 3, wherein the metallized contact is made directly to the P-surface of the semiconductor crystal without an intervening layer of silica therebetween.

Referring to FIG. 1, the structure shown in FIG. 1A is a semiconductor device prepared for application of the backside ohmic contact according to this invention. In this embodiment, 1 is an N-type gallium arsenide phosphide crystal characterized as having a phosphorus content within the range of 30 to 50 percent, a carrier concentration of from $10\times10^{16}$ to $1.0\times10^{18}$ carriers/c.c. of tellurium, a mobility in excess of 1,300, a resistivity of about 0.028 ohm-cm. and a dislocation density of less than 2,000/cm.$^2$; the crystal thickness is from 0.006 to 0.008 inch. The gallium arsenide phosphide wafer used in this example had previously been epitaxially grown on a substrate of single crystal N-type GaAs doped with tellurium and having a resistivity within the range of 0.001–0.005 ohm-cm. After the gallium arsenide phosphide layer is prepared for lead bonding, in the manner described below, the GaAs substrate is removed by lapping and the backside ohmic contact attached in the manner herein described.

In crystal 1 is formed a surface region 2 of P-type conductivity which has been diffused with zinc arsenide at 800° C. for 50 minutes to form a P-region having a PN-junction depth of 6 microns. In one embodiment, the diffusion mask (not shown) used for the zinc arsenide diffusion comprises a layer of silicon dioxide deposited on the gallium arsenide phosphide crystal followed by a layer of a phosphorus doped silicon dioxide layer and another layer of silicon dioxide. By means of conventional photoresist techniques a window of the desired geometrical configuration is opened to expose the crystal to the above mentioned diffusion. After the diffusion, the diffusion mask and about 3–4 microns of the gallium arsenide phosphide is removed by etching with a suitable e.g., a mixture of sulfuric acid and hydrogen peroxide. A new layer of silicon dioxide is deposited over the cleaned surface of the surface of the crystal and by using a photosensitive resist method, a mask is used to define and, by etching, expose an area of the P-region of the crystal in such manner as to leave a portion of the silica covering the PN-junctions at the surface of the crystal. Thereafter, a layer of aluminum is evaporated over the surface of the crystal making contact with the exposed area of the P-region. Again, using photosensitive resist techniques a mask is used to define the area of the aluminum contact in the desired configuration. By means of etching, portions of the aluminum layer not used in the areas corresponding to the desired aluminum contact configuration 4 are removed. The resulting semiconductor structure is now ready for application of the backside ohmic contact according to this invention.

In FIG. 1B is shown a preferred sequence of layering the backside ohmic contact materials. In sequence, a layer 5 of tin is first evaporated onto the backside of crystal 1, then a layer 6 of gold is evaporated onto the tin layer. Next, a layer 7 of nickel is plated onto the first gold layer and a second layer 8 of gold evaporated onto the nickel layer to protect it against oxidation. This multilayered contact structure is then heated to 430° C. for about 30 minutes or, in general, to a temperature sufficiently high to alloy the metals in the layers with the components of the N-type region 1 of the semiconductor and form a region 9 of $N^+$ conductivity and a metallic layer 10 high in nickel content as shown in FIG. 1C.

A modification of the preceding embodiment is to alloy the tin layer 5 and first gold layer 6 (FIG. 1B) with the N-type crystal at about 430° C. in a nitrogen atmosphere to create the $N^+$ region 9 shown in FIG. 1C, and then plate with the nickel and evaporated gold layers, 7 and 8, respectively, and again heat to alloy the nickel and gold with the components of the $N^+$ layer 9 and form the nickel-rich layer 10 shown in FIG. 1C.

After the alloying operation described above, the semiconductor crystal, upon which may be formed many discrete diodes or arrays of diodes, is scribed and broken into individual units ("die" or "dice"). In FIG. 1D, the die is then mounted with a gold/epoxy preform 11 on a Kovar base 12 plated with a layer of gold 13 and heated to bond the die to the base. Gold leads, or other suitable lead material, 14 and 15 in FIG. 1D are attached as shown. The device is then packaged, suitably with an epoxy lens (not shown).

In other embodiments of the invention, the base 12 may be various conductors, insulators or semi-insulators plated with or screen printed and fired with various metals or alloys. One preferred embodiment makes use of an alumina base screen printed with a gold/palladium alloy and fired. Other suitable plating or screen printed materials for the base include various metals and alloys such as molybdenum and/or manganese, molybdenum/gold, etc. Other preforms such as alloys of various metals, e.g., gold/silicon, tin/lead, gold/germanium alloy, can suitably be used herein. Any plating or screen print material and preform material capable of forming good mechanical and electrical connection with the semiconductor component and the base or header may be used.

EXAMPLE 2

A further embodiment of the invention is shown in FIG. 2. In the embodiment of this example, the backside ohmic contact procedures used in example 1 are followed, but the device is otherwise altered by applying the metallized P-surface contact directly to the surface of the crystal. Again, the desired metal contact configuration is effected by photoresist techniques. In this example, aluminum contact 4*a* of any configuration is attached to a center portion of the P-region 2. Electrical leads, 14 and 15, of gold wire, or any other suitable material, are bonded to the device, after which the device is packaged, e.g., in clear epoxy resin, and ready for use.

EXAMPLE 3

A further embodiment of this invention is shown in FIG. 3. An epitaxial film of $GaAs_{1-x}P_x$, 1, is epitaxially deposited on a substrate of N-type GaAs (comprising the N and $N^+$ layers 16 and 17, respectively) as in example 1. In this embodiment, the GaAs substrate is not removed (but it may be reduced in thickness) by lapping, but is retained as an integral part of the LED device fabricated. The backside ohmic contacting procedure described above is applied to the GaAs surface, thereby forming an $N^+$ region 17 and a nickel-rich region 18 therein. The device is then bonded to a suitable base 12, such as gold-plated Kovar, by means of a gold/epoxy preform 19. Electrical leads are attached and the device is packaged as described above for use. ($x$ equals 0 to 1 inclusive.)

EXAMPLE 4

The embodiment described in this example is shown in FIG. 4. The device according to this embodiment combines features described in examples 2 and 3 and shown, in part, in FIGS. 2 and 3. In particular, in FIG. 4 the GaAs substrate (represented by layers 16 and 17, prior to forming the $N^+$ region) used in the original epitaxial deposition of the gallium arsenide phosphide layer 1, is retained and the above described multilayered ohmic contact system attached thereto in the manner described above. After alloying at 430° C. for 50 minutes, an $N^+$ region 17 is formed in the N-type GaAs and a nickel-rich layer 18 is formed below the $N^+$ region of the GaAs crystal. The device is bonded to a gold/palladium screen printed and fired alumina base 12 by means of a gold/germanium alloy 13.

In general, the ohmic contact alloying temperatures useful in the embodiments described above are within a range of 400° to 500° C. for times within a range of from 0.5 minutes to an hour, but these temperatures and times are further adjustable to achieve the necessary alloying.

In similar manner as described in the preceding, suitable ohmic contacts with other N-type semiconductor materials such as germanium, silicon and alloys thereof and II–VI compounds such as the sulfides, selenides, and tellurides of zinc, cadmium, mercury and mixtures thereof; IV–VI compounds such as selenides and tellurides of lead and III–V compounds such as nitrides, phosphides, arsenides and antimonides of boron, aluminum, gallium, indium and mixtures thereof. It will be appreciated, of course, that any N-type crystal capable of alloying with the contact system of this invention to provide good mechanical and electrical connection is contemplated by this invention. A further understanding is that the times and temperatures and other conditions required to obtain the necessary ohmic contact according to this invention will vary according to the requirements of specific semiconductor device materials.

While the invention has been particularly shown and described with reference to preferred embodiments thereof, it will be understood by those skilled in the art that the foregoing is merely exemplary and not exhaustive of the invention and that still other modifications of the invention will occur to those skilled in the art without departing from the spirit and scope of this invention. For example, while the description makes particular reference to forming the ohmic contact of this invention on the backside of the crystal, it will be appreciated that the contact may equally well be formed on the top or front surface where desirable, as in operations requiring the P-surface of the crystal to be in the backside position or where ohmic contact is required on an N-type top surface region of a crystal as in transistors. Also, it will be appreciated that the various components of the ohmic contact system may be applied in layers of varying thickness and heated at various times, temperatures and pressures in order to produce the ohmic contact according to this invention. Moreover, it is further understood that the method(s) by which the various layers are applied is not critical, and that the various layers may be applied by techniques selected from those known to one skilled in the art, such as by controlled evaporation, spraying, sputtering, painting, electrolytic plating, etc., and/or selected combinations of these and other techniques.

We claim:

1. A method of forming an ohmic contact to a semiconductor device which comprises:

a. providing a semiconductor device having a region of N-type conductivity;
b. applying a layer of tin to an N-type surface of said semiconductor device;
c. applying a layer of gold on said layer of tin;
d. applying a layer of nickel on said layer of gold;
e. applying a layer of gold on said layer of nickel;
f. heating the combined structure formed in steps (a)–(e) at temperatures and for a time sufficient to alloy the metals in the layers of steps (b)–(e) with said region of N-type conductivity and form a region of $N^+$ conductivity type therein and a layer rich in nickel and;
g. mounting the alloyed structure formed in step (f) on a suitable base by means of a suitable preform.

2. Method according to claim 1 wherein the semiconductor component of said semiconductor device comprises N-type $GaAs_{1-x}PBx$, wherein $x$ is a number from 0 to 1 inclusive.

3. Method according to claim 2 wherein said $GaAs_{1-x}P_x$ is in epitaxial connection with a substrate of N-type GaAs.

4. Method according to claim 1 wherein said preform is a gold/epoxy mixture and said base is gold plated Kovar.

5. Method according to claim 1 wherein said preform is a gold/germanium alloy and said base is alumina with a screen printed and fired gold/palladium alloy.

6. Method of forming an ohmic contact to a semiconductor device which comprises:

a. providing a semiconductor device having a region of N-type conductivity;

b. applying a layer of tin to an N-type surface of said semiconductor device;

c. applying a layer of gold to said layer of tin;

d. heating the combined structure formed in steps (a)–(c) at temperatures and for a time sufficient to alloy the metals in the layers of steps (b) and (c) with said region of N-type conductivity and form a region of $N^+$ conductivity type therein;

e. applying a layer of nickel to said region of $N^+$ conductivity type;

f. applying a layer of gold to said layer of nickel;

g. heating the structure formed through steps (d)–(f) at temperatures and for a time sufficient to alloy the metals in the layers of steps (e) and (f) with said region of $N^+$ conductivity type and form a layer rich in nickel and;

h. mounting the structure formed in step (g) on a suitable base by means of a suitable preform.

7. Method according to claim 6 wherein the semiconductor component of said semiconductor device comprises N-type $GaAs_{1-x}PBx$, wherein $x$ is a number from 0 to 1 inclusive.

8. Method according to claim 7 wherein said $GaAs_{1-x}P_x$ is in epitaxial connection with a substrate of N-type GaAs.

9. Method according to claim 6 wherein said preform is a gold/epoxy mixture and said base is gold plated Kovar.

10. Method according to claim 6 wherein said preform is a gold/germanium alloy and said base is alumina with a screen printed and fired gold/palladium alloy.

* * * * *

PO-1050
(5/69)

UNITED STATES PATENT OFFICE
CERTIFICATE OF CORRECTION

Patent No. 3,636,618 Dated March 23, 1970

Inventor(s) Arno Henry Herzog et al

It is certified that error appears in the above-identified patent and that said Letters Patent are hereby corrected as shown below:

Column 4, line 64, "$GaAs_{1-x}PBx$" should be --$GaAs_{1-x}P_x$--.

Column 4, line 65, "$GaAs_{1\ x}P_x$" should be --$GaAs_{1-x}P_x$--.

Column 6, line 6, "$GaAs_{1-x}PB_x$" should be --$GaAs_{1-x}P_x$--.

Signed and sealed this 12th day of December 1972.

(SEAL)
Attest:

EDWARD M.FLETCHER,JR.
Attesting Officer

ROBERT GOTTSCHALK
Commissioner of Patents